(12) United States Patent
Verhoeven

(10) Patent No.: US 9,698,792 B1
(45) Date of Patent: Jul. 4, 2017

(54) SYSTEM AND METHOD FOR CLOCKING DIGITAL LOGIC CIRCUITS

(71) Applicant: NXP B.V., Eindhoven (NL)

(72) Inventor: Henri Verhoeven, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/358,785

(22) Filed: Nov. 22, 2016

(51) Int. Cl.
H03K 19/00 (2006.01)
H03K 19/177 (2006.01)

(52) U.S. Cl.
CPC ... H03K 19/1774 (2013.01); H03K 19/17748 (2013.01)

(58) Field of Classification Search
None
See application file for complete search history.

(56) References Cited

U.S. PATENT DOCUMENTS

| | | | | |
|---|---|---|---|---|
| 5,319,369 A * | 6/1994 | Majos | ...................... | H03M 9/00 341/101 |
| 5,327,019 A * | 7/1994 | Kluck | ................... | H03K 23/507 326/52 |
| 5,731,728 A * | 3/1998 | Greiss | ..................... | H04B 15/04 327/114 |
| 6,078,637 A * | 6/2000 | Ansel | ........................ | G11C 8/04 365/236 |
| 6,201,829 B1 * | 3/2001 | Schneider | ................ | H04L 1/244 375/221 |
| 6,327,691 B1 * | 12/2001 | Huang | ................ | G11B 20/1813 714/781 |
| 7,365,580 B2 * | 4/2008 | Martin | .................... | H03L 7/081 327/147 |
| 7,724,059 B2 * | 5/2010 | Kapur | ........................ | G06F 1/06 327/115 |
| 7,786,913 B2 * | 8/2010 | Waheed | ................ | G04F 10/005 327/146 |
| 2002/0196883 A1 * | 12/2002 | Best | .......................... | G06F 1/10 375/355 |
| 2005/0077934 A1 * | 4/2005 | Fahim | ..................... | G06F 1/022 327/155 |
| 2007/0273408 A1 * | 11/2007 | Golic | ....................... | G06F 7/584 326/93 |
| 2008/0256641 A1 * | 10/2008 | Lo | ............................ | G06F 21/10 726/26 |
| 2009/0327357 A1 * | 12/2009 | Beglin | ................. | G06F 11/1435 |
| 2010/0141317 A1 * | 6/2010 | Szajnowski | ............ | H03C 3/406 327/160 |

* cited by examiner

Primary Examiner — Crystal L Hammond (57) ABSTRACT

An electronic device includes multiple functional logic modules each having a corresponding settling time, a clock generator element, and multiple memory elements. The clock generator element generates multiple clock signals having clock periods of a common duration. Each clock signal has a first clock transition and a second clock transition during each clock period, and a latest second clock transition of the clock signals in a particular clock period precedes an earliest first clock transition in a subsequent clock period by the settling time. Each memory element is clocked by a respective one of the clock signals, and each memory element includes an input latch clocked on a first clock transition of the respective one of the clock signals, and an output latch clocked on a second clock transition of the respective one of the clock signals.

20 Claims, 5 Drawing Sheets

*FIG. 5*

SYSTEM AND METHOD FOR CLOCKING DIGITAL LOGIC CIRCUITS

FIELD OF THE DISCLOSURE

The present disclosure relates generally to digital systems and methods, and more particularly to clocking digital synchronous logic.

BACKGROUND

Digital systems can be designed to include combinatorial circuitry and storage circuitry. Combinatorial circuitry comprises logic gates of digital systems and receive one or more input signals, but do not form or have any internal storage circuitry. As such, the combinatorial circuitry can produce output signals based only on a current state of the input signals. Storage circuitry can include various types of storage elements, such as flip-flops and latches, that can store a value received at their input terminal, and can then provide the stored value as an output value at an output terminal. In a digital synchronous system the output value of a storage circuitry can be provided as input data to combinatorial circuity in a subsequent clock cycle, and values provided from the combinatorial circuitry can be provided to the storage circuitry as input data.

Storage elements in digital synchronous systems receive clock signals that cause a storage element to store a value at its input and to provide the stored value at its output terminal. In a digital synchronous design, a common clock signal can be provided to all of the storage elements. In such a design, all of the storage elements can change states within a short time interval of each other. For example, if all of the storage elements receive the clock signal at the same time, they will update their stored value at substantially the same time.

Having the same clock signal arrive at multiple storage elements at the same time results can result in simultaneous switching of the storage circuitry, which can cause a large amount of electromagnetic radiation, as well as a high degree of substrate noise, in the digital synchronous system. The amount of electromagnetic radiation and substrate noise can be sufficiently high that it can be detected and analyzed by test equipment external to the digital synchronous system. By analyzing the electromagnetic signals produced by a large number of clock transitions, details of the operation of the digital synchronous system can be predicted. For a digital synchronous system that processes confidential information, such analysis can be used to determine the confidential information. In addition, storage elements consume power upon storing values in response to the clock signal input. Thus, providing the digital synchronous system with a single clock signal can cause a large amount of electromagnetic radiation, can cause high substrate noise, and can allow confidential information to be determined.

BRIEF DESCRIPTION OF THE DRAWINGS

The present disclosure may be better understood, and its numerous features and advantages made apparent to those skilled in the art by referencing the accompanying drawings. It will be appreciated that for simplicity and clarity of illustration, elements illustrated in the Figures have not necessarily been drawn to scale. For example, the dimensions of some elements are exaggerated relative to other elements. Embodiments incorporating teachings of the present disclosure are shown and described with respect to the drawings presented herein, in which.

DETAILED DESCRIPTION OF THE DRAWINGS

In accordance with an embodiment of the present disclosure, a synchronous digital system, such as a near field communication (NFC) device, includes combinatorial logic modules, storage elements, and a clock generator module. The combinatorial logic modules have a characteristic time, referred to as a settling time. The settling time is the maximum length of time after a change in an input value is received at an input terminal of one of the combinatorial logic modules until all outputs of that combinatorial logic module are guaranteed to reach a steady state value in response to the input change. The clock generator module can generate multiple clock signals that do not change value simultaneously. Each storage element can receive a different clock signal. Electromagnetic signal analysis and power consumption analysis can be more difficult by randomly varying when the various multiple clock signals change—which is desirable in secure applications. In order to maintain proper operation, the multiple clock signals can be configured such that each of the clock signals can cause their respective storage elements to store an input value before any their storage elements output the stored value, as will be better understood based on the following description based on FIGS. 1-5.

Figure 1:
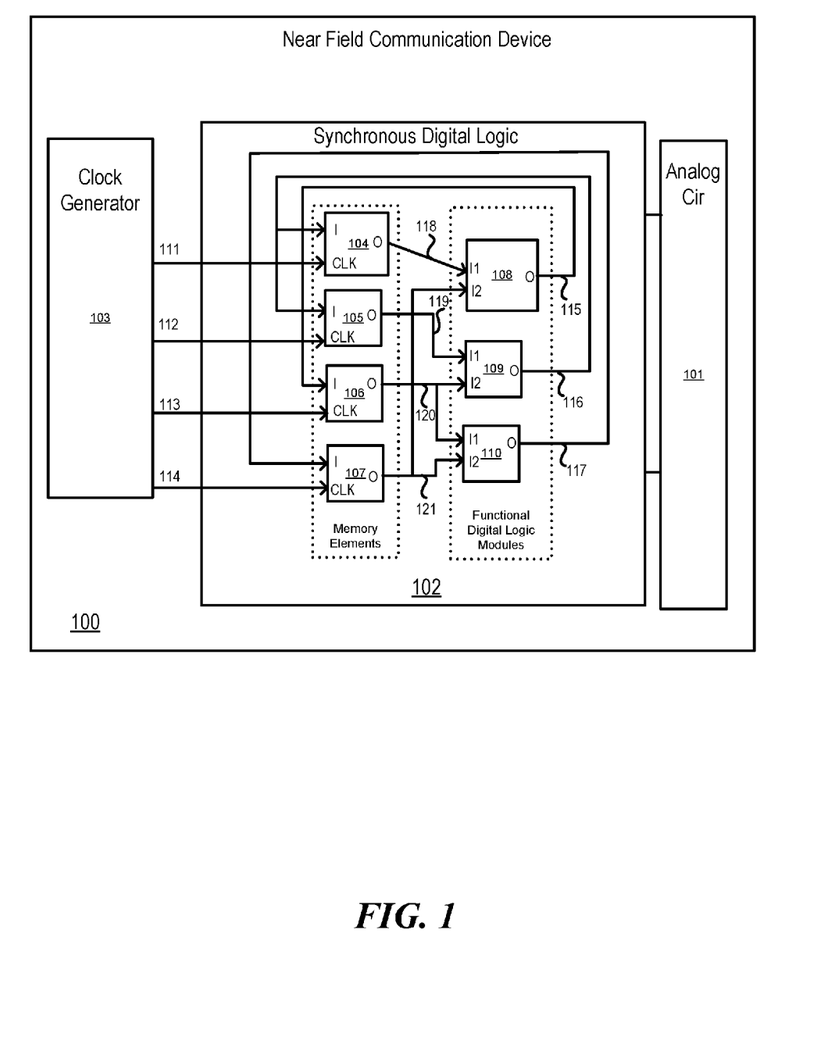
FIG. 1 is an illustration of a near field communication device including a synchronous digital system according to at least one embodiment of the present disclosure.

FIG. 1 illustrates an embodiment of a device 100, presumed to be a near field communication (NFC) device, including analog circuitry 101, synchronous digital logic 102, and a clock generator 103 according to at least one embodiment of the present disclosure. Analog circuitry 101 includes radio frequency (RF) circuitry to enable communication with other near field communication devices. In an embodiment, the RF circuitry can include amplifiers, digitizers to extract digital bit streams from an analog RF signal, and circuitry to extract power from the RF signal to power NFC device 100. Analog circuitry 101 is connected to synchronous digital logic 102 to send/receive digital bits and to provide power.

Synchronous digital logic 102 implements a state machine and includes storage elements 104, 105, 106, and 107 and combinatorial digital logic modules 108, 109, and 110, As used herein, the term combinatorial digital logic module is intended to mean circuitry that receives and generates digital signal without any intervening storage elements. Each of the storage elements 104-107 includes its own data input I, data output O, and clock signal input CLK. During operation, each storage element can maintain an internal logical state that is set using the data at input I. The stored data is provided to output O as output data, as will be described herein. Each of the combinatorial digital logic modules 108-110 includes its own data inputs I1 and I2, and data output O. There are no data storage elements within combinatorial digital logic modules 108-110, such that the output O is a function of the current values of inputs I1 and I2. Thus, respective outputs of combinatorial digital logic modules 108-110 change as their respective inputs change.

The data input terminal of storage element 106 is connected to the output terminal of the logic module 108 via interconnect 115. The data input terminals of storage elements 104 and 105 are connected to the output terminal of the logic module 109 via interconnect 116. The data input terminal of storage element 107 is connected to the output of the logic module 110 via interconnect 117. It will be appreciated, that for convenience, a label or reference number associated with an interconnect can be used herein to also refer to a signal and information transmitted by the interconnect. For example, a signal transmitted over interconnect 115 can be referred to herein as signal 115. It will be further appreciated that in embodiments there may be additional intervening circuitry, not shown in the figures, between connections and circuitry depicted in the figures. In particular embodiments, such additional intervening circuitry does not affect the operation of the disclosed invention as described herein.

The data output terminal of storage element 104 is connected to input terminal I1 of logic module 108 via interconnect 118. The data output terminal of storage element 105 is connected to input terminal I1 of logic module 109 via interconnect 119. The data output terminal of storage element 106 is connected to input terminal I2 of logic module 109 and to input terminal I1 of logic module 110 via interconnect 120. The data output terminal of storage element 107 is connected to input terminal I2 of logic module 108 and to input terminal I2 of logic module 110 via interconnect 121. It will be appreciated that the numbers and interconnections of storage elements and combinatorial digital logic modules shown in FIG. 1 is for illustrative purposes. Different arrangements of storage elements and combinatorial digital logic modules can be used without varying from the scope of the present disclosure. For example, more than one storage element can be connected to a particular clock signal as will be discussed herein.

The clock signal input terminals of storage elements 104-107 are connected to respective output terminals of the clock generator 103 via interconnects 111, 112, 113, and 114 to receive corresponding clock signals, referred to herein as clock signals 111-114. A clock signal transition can be defined as a change from one state to another state. A transition from a high state to a low state can be termed a falling transition, while a transition from a low state to a high state can be termed a rising transition. As used herein, the term 'high state' refers to a digital logic TRUE, e.g., voltage value of Vdd, and the term 'low state' refers to a digital logic FALSE, e.g., a voltage value of GND. The duration between common transition types, e.g. rising transitions, of a periodic signal can be referred to as a period of the signal. When the signal is a clock signal, the period can be referred to as a clock period. The ratio of a high state duration to clock period duration can be referred to as a clock duty cycle of the clock signal. Each clock signal also includes a clock phase, which, as used herein is intended to refer to the position of the high state relative to the beginning of a reference clock period. Each of the clock signals 111-114 can have a common clock period duration.

The clock generator 103 can contain circuitry to control the time at which the rising and falling transitions of each clock signal of clock signals 111-114 occur within a reference clock period. According to an embodiment, the clock generator 102 randomly controls the time at which the rising and falling transitions occur with a reference clock period. The location in time of this reference clock period can be defined relative to a specific clock, or can be arbitrarily located in time. In an embodiment, the reference clock period is a clock period of a particular clock signal that transitions first in time. In another embodiment, a reference clock period does not correspond to a clock period of any particular signal in a system but is an abstraction used herein for explanatory purposes. In an embodiment, the clock phase of each clock signal 111-114 relative to the reference period can be different from the clock phase of each other of the clock signals 111-114, such that each of the clock signals have a different phase as compared to each other clock signal as will be discussed in greater detail below.

Clock transitions control the internal state of storage elements 104-107. For example, a clock signal transition at the CLK input of a storage element 104-107 can store the logic value represented at its data input I, but not present the stored data at its data output O. For example, at a falling transition of its CLK input, storage element 104 can store the logic value represented by signal 116. An opposite transition of a CLK input of a storage element 104-107 controls the presentation of a storage element's stored logic value at its data output O. Thus, in an embodiment, a falling transition of a CLK input stores a value at a data input I into a storage element, and a rising transition of the CLK input causes the storage element to output the newly stored value at its data output O.

Synchronous digital logic 102 can have a requirement on the relative transition times at which clock signals provided to the storage elements 104-107 transition. For example, a maximum interval between reception of an earliest (first in time) clock signal transition of clocks 111-114 and a latest (last in time) clock signal transition of clocks 111-114, as received at the storage elements 104-107, can be specified to ensure proper operation of synchronous digital logic 102.

By virtue of the outputs of the functional digital logic modules 108-110 being connected to the data inputs of storage elements 104-107, it will be appreciated that there is a feedback path from the combinatorial digital logic module to the storage elements. Thus storage elements 104-107 receive values at their respective inputs I that are generated by combinatorial digital logic modules 108-110 during the preceding clock period.

Clock signals as described herein are distributed from clock generator 103 to storage elements 104-107. A common technique implemented to maintain the specified maximum interval between reception of an earliest and latest clock signal transition is to specifically structure clock tree circuitry for clock generator 103 and clock signals 111-114. The process of designing such a clock tree to meet requirements can be referred to as balancing the clock tree. The difficulty of balancing a clock tree for a particular clock signal is to some degree proportional to the number of switching elements to receive the particular clock signal. More elements receiving the clock signal can increase the difficulty of balancing the clock tree. Further, more elements receiving the clock signal can increase the number of components such as buffers in the clock generator circuitry. In various embodiments, the use of multiple clock signals and two-latch storage elements as described herein reduces the number of storage elements receiving a particular clock signal, and thus can reduce the difficulty of balancing clock trees and also reduce a number of components in clock generation and distribution circuitry.

Figure 2:
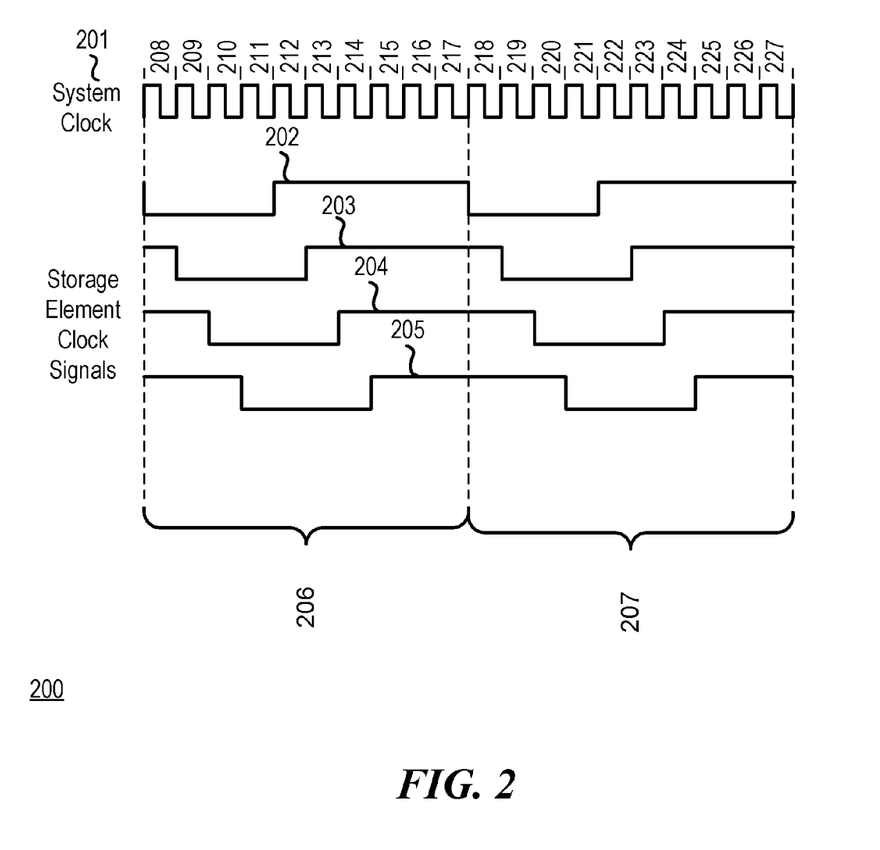
FIG. 2 is a timing diagram illustrating relationships among clocks according to at least one embodiment of the present disclosure.

FIG. 2 shows timing diagram 200 illustrating a clock scheme for use with synchronous digital logic 102 according to at least one embodiment of the present disclosure. A high frequency system clock signal 201 can be provided to an input (not shown) of clock generator 103. Storage element clock signals 111, 112, 113, and 114 generated by clock generator 103 are represented by clock waveforms 202, 203, 204 and 205 respectively. The clock period of each of clock waveforms 202-205 is equal to 10 clock periods of high frequency system clock 201. The clock period of clock signal 202 is used as a reference clock period, wherein FIG. 2 illustrates a reference clock period 206 and a reference clock period 207, and therefore each reference clock period begins at a falling edge of clock signal 202.

Reference clock period 206 includes clock periods 208-217 of high frequency system clock signal 201. Similarly reference clock period 207 includes clock periods 218-227. A time interval from a falling transition to the next rising transition, a negative pulse, for each of clock waveforms 202-205 is equal to 4 clock periods of high frequency system clock 201. The time between a rising transition and the next falling transition, a positive pulse, is equal to 6 clock periods of high frequency system clock 201. The falling transitions of clock waveforms 202, 203, 204 and 205 are offset from the beginning of a storage element clock period by 0, 1, 2 and 3 cycles of clock waveform 201, respectively. Storage elements 104-107 store the value at their respective inputs I in response to falling clock transitions at their respective CLK inputs. The offset of the falling transitions from the beginning of a storage element clock period for clock waveforms 202-205 can cause a lower amount electromagnetic radiation and lower substrate noise on the synchronous digital logic 102 that includes the storage elements 104-107 as compared to all of the falling transitions of the clock signals 702-705 occurring at the same time.

As mentioned previously, proper operation of digital synchronous logic 102 using clock waveforms 202-205 places constraints upon the operation of storage elements 104-107. In particular, within a reference clock period 206 and 207, none of the storage elements 104-107 should change their respective output to reflect newly stored data until after the signal at its output has fully propagated to any other storage element. For example, input I of storage element 106 is connected to the output O of storage element 104 through interconnect 115, functional digital logic module 108 and interconnect 118. Therefore, storage element 104 should not change its output O in a particular storage element clock period before storage element 106 has stored a new value in the clock period that is dependent upon the value at the output of storage element 104. However, storage element 106 is clocked by clock waveform 202 and storage element 106 is clocked by clock waveform 204. The falling transition of clock waveform 702 occurs before the falling transition of clock waveform 204. Were storage element 104 to change its output O immediately in response to a falling transition of its CLK input, the value at the input I of storage element 106 could change before the falling transition of clock waveform 204. Such an event could cause storage element 106 to store an improper value.

Those skilled in the art will appreciate that the particular fixed relationship between the high frequency system clock and the storage element clocks illustrated at FIG. 2 has been chosen for ease of discussion. In accordance with another embodiment, the location of the negative pulse for each of the clock waveforms 202-205 relative to each other can have been chosen based on a random number generator, and the location of the negative pulses relative to each other can periodically change during operation to obfuscate operation of the device. Other embodiments can have different relationships among the clock signals while remaining within the scope of the present disclosure. Thus the offsets of the falling transitions and rising transitions of the storage element clocks 111-114 from each other can be chosen based on requirements of a particular system, subject to the constraints that all storage element clocks must have a falling transition before any storage element clock has a rising transition during a particular reference clock period, and that all storage element clocks must have a rising transition during a reference clock period.

Figure 3:
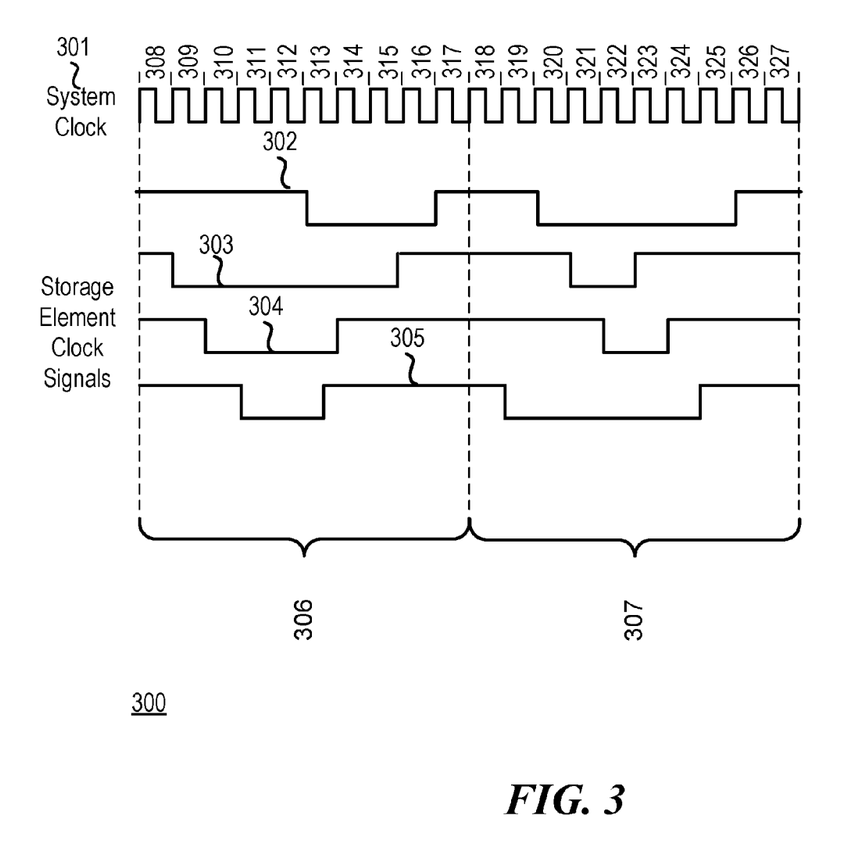
FIG. 3 is a timing diagram illustrating another relationships among clocks according to at least one embodiment of the present disclosure.

FIG. 3 shows timing diagram 300 illustrating a second clock scheme for use with synchronous digital logic 102 according to at least one embodiment of the present disclosure. Timing diagram 300 includes system clock 301. Storage element clock signals 111, 112, 113, and 114 generated by clock generator 103 are represented by clock waveforms 302, 303, 304 and 305 respectively. Waveforms 302-305 include repeated rising and falling transitions, but in contrast with waveforms 202-205 the rising and falling transitions of a particular waveform do not occur at particular fixed intervals and thus cannot be described as having a clock period in a strict sense, because the location of the transitions can change. Therefore, instead of defining a reference clock period based upon the period of a specific clock period, at FIG. 3 a reference clock period is defined by a fixed number of periods of the system clock 301. Thus as illustrated, reference clock periods 306 and 307 are equal to the duration of 10 periods of system clock 301. Reference clock period 306 begins at system clock period 308 includes system clock periods 308-317. Reference clock period 307 begins at system clock period 318 and includes system clock periods 318-327. Thus, each of the reference clock periods 306 and 307 has a period defined by 10 clock periods of system clock 301, and includes a falling transition followed by a rising transition for each of waveforms 302-305.

As discussed with respect to FIG. 2, proper operation of digital synchronous logic 102 using multiple storage clock waveforms can be obtained when, for a particular reference clock period, all storage element clocks 111-114 have falling transitions before any storage element clock 111-114 has a rising transition, and all storage element clocks 111-114 have rising transitions before the end of the reference clock period. Reference clock periods 306-307 each include falling and rising transitions of waveforms 302-305, with all falling transitions occurring before any rising transition within a reference clock period 306-307, thus satisfying the requirements for proper operation of digital synchronous logic 102. However, as the rising and falling transitions of waveforms 302-305 do not occur at regular intervals, and the length of intervals between falling and rising edges can vary, reverse engineering of digital synchronous logic 102 is made more difficult. This can be advantageous when a high degree of data security is desired.

Positions of falling transitions of waveforms 302-305 relative to the beginning of reference clock periods can vary. For example, waveform 302 has a falling transition at the beginning of system clock period 313, the sixth system clock period of reference clock period 306 and at the beginning of system clock period 320, the third system period of system clock of reference storage element clock period 307. Duration of an interval between falling and rising transitions of waveforms 302-305 can also vary among reference clock periods. For example, for waveform 302, the duration between falling and rising transitions at reference clock period 306 includes four system clock periods 313-316, while at reference clock period 307 the duration between falling and rising transitions includes six system clock periods 320-325. Further, the ordering of falling and rising transitions of waveforms 302-305 can vary among reference storage element clock periods. At reference clock period 306, falling transitions of waveforms 302-305 occur in the sequence 303, 304, 305 and 302, while at reference clock period 307 the sequence of falling transitions is 305, 302, 303, and 304. Similarly, the ordering of rising transitions of waveforms 302-305 differs between reference clock periods 306 and 307. Further, the ordering of falling transitions of waveforms 302-305 differs from the ordering of rising transitions at reference clock periods 306 and 307. According to an embodiment, the ordering of the rising and falling transitions are determined independent of one another, such as based upon different random numbers.

Figure 4:
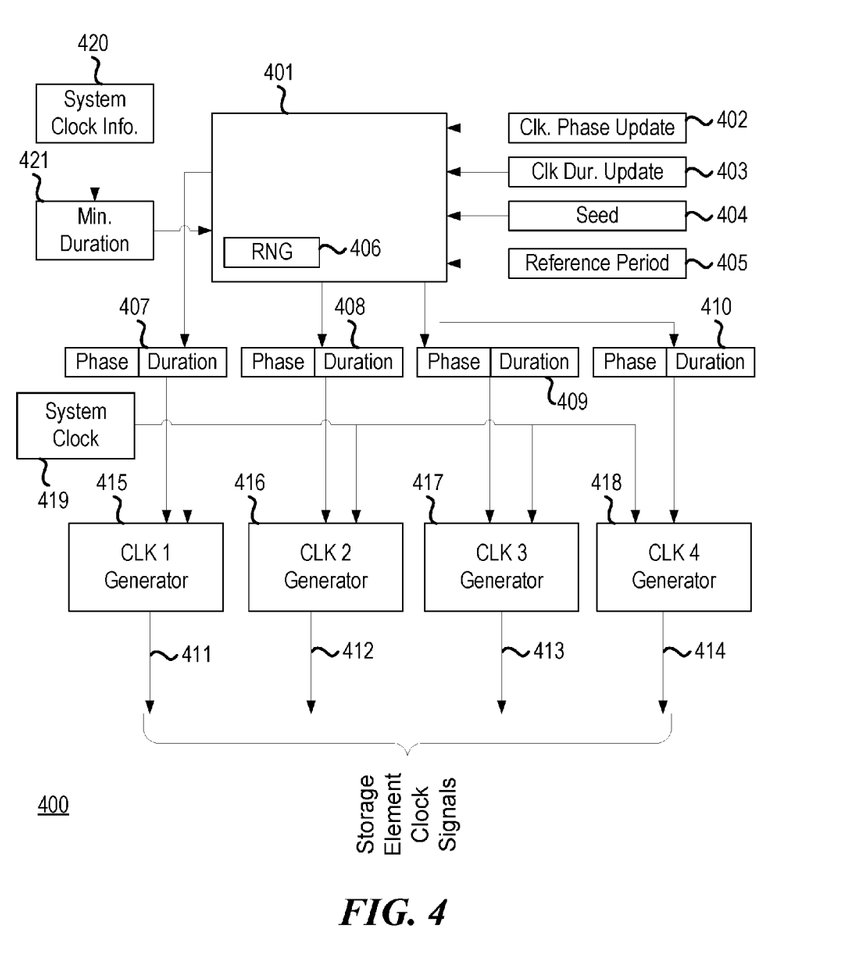
FIG. 4 is an illustration of a clock generator module according to at least one embodiment of the present disclosure.

FIG. 4 illustrates a block diagram of a clock generator module 400 for generating clock waveforms having falling and rising transitions that can vary among reference clock periods, according to an embodiment. Clock generator module 400 includes clock configuration module 401 for generating pseudo-random phase and duration information. Clock configuration module 401 receives configuration information from clock phase update interval register 402, clock duration update interval register 403, seed register 404 and reference period register 405. Registers 402-405 can be configuration registers of an information processing system which are programmable to configure clock configuration module 401 as will be described herein.

Clock configuration module 401 further receives configuration information from minimum duration module 421. Minimum duration module 421 receives input from system clock information module 420, and computes a minimum duration for storage element clocks that will ensure proper operation of a synchronous digital logic system. Information provided by system clock information module 420 can include, for example, a frequency of a system clock to be used to generate storage element clock signals. In various embodiments system clock information module 420 can be a register of an information system configurable by the execution of code on a processor of the information system, or circuitry determined at the time of design or manufacture. Clock configuration module 401 further includes random number generator 406.

Clock configuration module 401 is further connected to phase/duration registers 407-410. Based upon configuration information, clock configuration module 401 uses random number generator 406 to compute a phase and a pulse duration for each storage element clock. A phase of a storage element clock is a delay of a falling transition of the storage element clock relative to the beginning of a reference clock period as described previously. Duration of a storage element clock is a duration between a falling transition and a rising transition as described previously. Clock configuration module 401 writes phase and duration information for particular storage element clock signals into phase/duration registers 407-410.

Storage element clock generator modules 415-418 are connected to system clock generator 419 and to phase/duration registers 407-410. Storage element clock generator modules 415-418 read phase and duration information from phase/duration registers 407-410 and generate storage element clocks 411-414 with phases and durations indicated. Storage element clocks 411-414 are an embodiment of clocks 111-114. The storage element clocks 411-414 generated by storage element clock generator modules 415-418 can be derived, in an embodiment, by counting clock periods of a system clock signal provided by system clock generator 419 as described herein.

In operation, clock generator module 400 will generate storage element clocks 411-414 each of which have a falling transition and a rising transition in each reference clock period. The duration of a reference clock period is a whole number of system clock periods determined by a value written into reference period register 405. Clock configuration module 401 generates pseudo-random values for phases and durations of storage element clocks using random number generator 406. Random number generator 406 can use any suitable pseudo-random number generation techniques well known in the art and based on the value provided in the seed register 404. Clock configuration module 401 indicates acceptable values of random numbers to random number generator 406 to ensure that generated storage element clocks 411-414 properly operate synchronous digital logic 102. In particular, clock configuration module 401 configures random number generator 406 such that all storage element clocks 411-414 have falling edges before any storage element clock 411-414 has a rising edge within each reference clock period, and that each storage element clock 411-414 will have a minimum duration between a falling edge and the subsequent rising as indicated by minimum duration register 421. New values for phase and duration are generated at intervals indicated by clock phase update interval register 402 and clock duration update interval 403, respectively. Values in registers 402 and 403 can be numbers of system clock periods. Generated phase and duration values are written into phase/duration registers 407-410 by clock configuration module 401. Storage element clock generators 415-418 read phase and duration information from phase/duration registers 407-410 and generate storage element clocks 411-414 with the indicated phases and durations.

Figure 5:
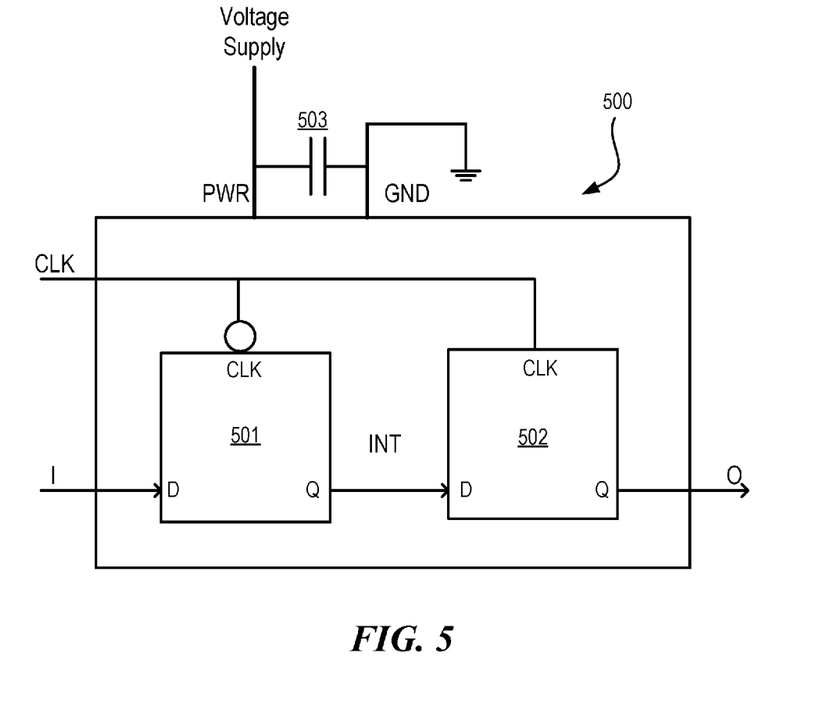
FIG. 5 is a schematic representation of a two-latch storage element according to at least one embodiment of the present disclosure.

FIG. 5 illustrates a two-latch storage element 500, which can be implemented within storage elements 104-107 of FIG. 1, according to at least one embodiment of the present disclosure. Two-latch storage element 500 includes a data input terminal, I, a data output terminal, O, a clock input terminal, CLK, and flip-flops 501 and 502. Flip-flops 501 and 502 each have a data input terminal, D, a data output terminal, Q, and an input clock terminal, CLK. Input terminal, I, of the two-latch storage element 500 is coupled to input terminal, D, of flip-flop 501. Output terminal, Q, of flip-flop 501 is coupled to input terminal, D, of flip-flop 502. Output terminal, Q, of flip-flop 502 is coupled to output terminal, O, of two-latch storage element 500. Clock input terminal, CLK, of two-latch storage element 500 is coupled to an inverted input CLK terminal of flip-flop 501, and is coupled to the input CLK terminal of flip-flop 502. Two-latch storage element 500 has a voltage supply terminal PWR and a ground terminal GND to provide electrical power to internal circuitry, and includes capacitor 503 coupled between PWR and GND terminals of storage element 500.

In embodiments of synchronous digital logic 102, switching of circuit elements such as two latch storage element 500 can cause voltage fluctuations on voltage supply lines to the system. Large voltage fluctuations on voltage supply lines in synchronous digital logic 102 can cause improper operation. The intensity of voltage fluctuations can be a function of the number of circuit elements switching simultaneously, with larger numbers of elements switching simultaneously causing larger voltage fluctuations. Voltage fluctuations on voltage supply lines can be reduced using capacitors, as illustrated by capacitor 503, connected between voltage supply lines and circuit ground lines. The capacitance value and physical size of capacitor 503 is determined in part by the size of voltage fluctuations. In an embodiment, larger voltage fluctuations require the use of larger capacitors to achieve a desired level of reduction in voltage fluctuations. In another embodiment, larger voltage fluctuations require the use of a larger number of capacitors to achieve a desired level of reduction in voltage fluctuations. Use of multiple clock signals as described herein can reduce the number of circuit elements switching simultaneously, thus reducing the size of voltage fluctuation on voltage supply lines. This, in turn, allows the use of smaller capacitors, fewer capacitors, or both fewer and smaller capacitors.

In other embodiments of the present disclosure, more than a single capacitor can be used with a circuit element such as storage element 500. In still other embodiments a single capacitor such as capacitor 503 can provide voltage fluctuation reduction for multiple circuit elements.

In an embodiment, flip-flops 501 and 502 are D-type flip-flops, such that in response to a transition of a signal at the input CLK terminal, the flip-flops 501 and 502 store the value on input terminal, D, and provide the stored value on output terminal, Q. Changes to the D input of a D-type flip-flop are not stored other than in response to a transition in the clock input signal. In an embodiment, flip-flop 501 inverts that clock signal provided at the input CLK terminal, such that flip-flop 501 stores an input value on a falling edge of the clock. Alternatively, flip-flop 502 stores an input value in response to a rising edge of its clock signal. The configuration of two-latch storage element 500 is such that the signal value at input terminal, I, is input into the two-latch storage element 500 at a falling transition of the clock signal, and then output at output terminal, O, of the two-latch storage element 500 on the next rising transition of the clock signal.

Descriptions of two latch storage element 500 can be added to component libraries of widely used design automation tools. Once the appropriate descriptions are added to a library, the design automation software tool can be used to design synchronous digital logic systems using multiple clock signals with two latch storage elements, such as two-latch storage element 500.

Clocking storage elements in a synchronous digital system with multiple clocks complicates analysis of electromagnetic signals emitted by the system and can reduce the size of current surges associated with clock transitions. Thus, the use of multiple clocks can mask the numbers of storage elements and gates that change state due to a particular input, obfuscating electromagnetic emissions and making detection of an operation and reverse engineering of the function of the system more difficult. In addition, other characteristics of the system can also be improved, for example a reduction in substrate noise in an integrated circuit implementation of the system. In an embodiment, substrate noise is reduced by a factor proportional to the inverse of a number of clock signals in a synchronous digital system. An additional example of improved characteristics is a reduction in voltage peaks on digital supply lines resulting from clock signals switching simultaneously. Lower voltage peaks can result in a particular system requiring fewer and/or smaller equalization capacitors.

Those skilled in the art will appreciate that other embodiments are possible within the scope of the present disclosure. For example, rising and falling transitions of clock signals can be replaced with falling and rising transitions, respectively, and the clocking of latches within a storage element can be reversed. Such a system will have an equivalent logical operation to the examples described previously.

As another example, a synchronous digital system can use storage elements in which latches of are clocked only by, for example, falling clock transitions. In such a system, two successive falling transitions of a single clock signal are required to latch input values and present new output values at storage elements. A reference clock in this system is thus twice as long as a reference clock in a system using both falling and rising clock transitions.

As a further example, a synchronous digital system can use different clock signals for the first and second latches in storage elements. Clock signals must be generated that cause all first latches to latch input values before any second latch is clocked to present an output value.

What is claimed is:

1. An electronic device, comprising:
   a plurality of combinatorial logic modules;
   a random number generator;
   a plurality of signal generators, each one of the plurality of signal generators comprising a corresponding output at which a corresponding clock signal of a plurality of clock signals is to be provided, wherein
      each of the corresponding clock signals having a clock transition of a first type and a clock transition of a second type during each period of a reference clock period,
      an order of the clock transitions of the first type provided by the plurality of signal generators is based upon information from the random number generator, and
      during each period of the reference clock period, a last-in-time clock transition of the first type provided by the plurality of signal generators precedes a first-in-time clock transition of the second type provided by the plurality of signal generators; and
   a plurality of storage elements, each storage element of the plurality of storage elements comprising:
      a data input coupled to a corresponding combinatorial logic module of the plurality of combinatorial logic modules,
      a clock input coupled to the output of a corresponding signal generator of the plurality of signal generators, and
      a latch output coupled to the output latch.

2. The device of claim 1, wherein during each period of the reference clock period, an order of the clock transitions of the second type provided by the plurality of signal generators is based upon information from the random number generator.

3. The device of claim 1, wherein the plurality of signal generators is further configured to order the clock transitions of the first type independent of the order of the clock transitions of the second type.

4. The device of claim 1, wherein
   a first signal generator of the plurality of signal generators is further configured to implement, during a particular period of the reference clock period, a first duration between its clock transition of the first type and its clock transition of the second type based on a first random number from the random number generator, and
   a second signal generator of the plurality of signal generators is further configured to implement, during the particular period of the reference clock period, a second duration between its clock transition of the first type and its clock transition of the second type based on a second random number from the random number generator.

5. The device of claim 1, wherein each storage element of the plurality of storage elements comprises:
   a first latch coupled to the data input of the storage element and to the clock input of the storage element, wherein the first latch stores a value at the data input in response to a clock transition of the first type; and
   a second latch coupled to the first latch to receive the value stored at the first latch, wherein the second latch stores the received value in response to a clock transition of the second type, and provides the stored value at its latch output.

6. The device of claim 1, wherein each one of the plurality of signal generators is further configured to provide a clock signal having a minimum duration between a clock transition of the first type and a next-in-time clock transition of the second type.

7. The device of claim 6, wherein the plurality of combinatorial logic modules is configured to have a maximum settling time, and the minimum duration is greater than the maximum settling time.

8. The device of claim 1, further comprising a system clock node configured to provide a system clock, and wherein each one of the plurality of signal generators is coupled to the system clock node, and is further configured to generate its clock signal based on the system clock.

9. A method, comprising:
   generating, at a signal generator of a synchronous digital system, a plurality of clock signals relative to a reference clock period, within each period of the reference clock period, each clock signal of the plurality of clock signals comprises a clock transition of a first type and a clock transition of a second type, wherein a last-in time clock transition of the first type amongst the plurality of clock signals precedes a first-in-time clock transition of the second type amongst the plurality of clock signals, and an ordering of clock transitions of the first type is determined by a pseudo-random value generator; and
   clocking each storage element of a plurality of storage elements with a corresponding clock signal of the plurality of clock signals.

10. The method of claim 9, wherein an ordering of clock transitions of the second type in a particular clock period is determined by the pseudo-random value generator.

11. The method of claim 9, wherein an ordering of clock transitions of clock transitions of the first type differs from an ordering of clock transitions of the second type in a particular reference clock period.

12. The method of claim 9, further comprising:
   for each storage element, latching, at an input latch, data at an input of the input latch in response to a clock transition of a first type, and latching, at an output latch, data from the input latch in response to a clock transition of the second type.

13. The method of claim 9, wherein each clock signal of the plurality of clock signals has a minimum duration between a transition of the first type and a next-in-time transition of the second type.

14. The method of claim 13, wherein the minimum duration is based on a settling time of a combinatorial logic element of the synchronous digital system.

15. An electronic device, comprising:
   a plurality of combinatorial logic modules;
   a clock generator to generate a first plurality of clock signals relative to a reference clock period, each clock signal of the first plurality of clock signals having a clock transition of a first type during each reference clock period, wherein an ordering of clock transitions of the first type in a particular reference clock period is determined by a pseudo-random value generator; and
   the clock server to generate a second plurality of clock signals relative to the reference clock period, each clock signal of the second plurality of clock signals having a clock transition of a second type during each reference clock period, wherein a last-in time clock transition of the first type amongst the first plurality of clock signals in each reference clock period precedes a first-in-time clock transition of the second type amongst the second plurality of clock signals; and
   a plurality of storage elements coupled to the plurality of combinatorial logic modules and to the clock generator element, each storage element clocked by a respective one of the first plurality of clock signals and a respective one of the second plurality of clock signals, wherein each storage element includes an input latch clocked on a first clock transition of the respective one of the first plurality of clock signals, and an output latch clocked on a second clock transition of the respective one of the second plurality of clock signals.

16. The device of claim 15, wherein an ordering of clock transitions of the second type in the particular reference clock period is determined by the pseudo-random value generator.

17. The device of claim 16, wherein the ordering of clock transitions of the first type in the particular reference clock period differs from an ordering of clock transitions of the second type in the particular reference clock period.

18. The device of claim 15, wherein an ordering of clock transitions of the first type in the particular reference clock period differs from an ordering of clock transitions of the second type in the particular reference clock period.

19. The device of claim 15, wherein a duration between a first clock transition at a particular storage element of the plurality of storage elements and a second clock transition at the particular storage element has a minimum value.

20. The device of claim 19 wherein the minimum value is based on a settling time of the plurality of combinatorial logic modules.

* * * * *